United States Patent
Ong et al.

(10) Patent No.: US 11,690,221 B2
(45) Date of Patent: Jun. 27, 2023

(54) CHARGE PUMP CIRCUIT CAPABLE OF GENERATING VOLTAGES IN ERASING OPERATION, PROGRAM OPERATION AND READ OPERATION

(71) Applicant: eMemory Technology Inc., Hsin-Chu (TW)

(72) Inventors: Wei-Chiang Ong, Hsinchu County (TW); Tsung-Ta Hsieh, Hsinchu County (TW); Chih-Yang Huang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 194 days.

(21) Appl. No.: 17/391,041

(22) Filed: Aug. 2, 2021

(65) Prior Publication Data
US 2022/0052605 A1   Feb. 17, 2022

Related U.S. Application Data

(60) Provisional application No. 63/065,512, filed on Aug. 14, 2020.

(51) Int. Cl.
*G11C 7/00*     (2006.01)
*H10B 41/60*    (2023.01)
(Continued)

(52) U.S. Cl.
CPC .......... *H10B 41/60* (2023.02); *G11C 16/045* (2013.01); *G11C 16/14* (2013.01); *G11C 16/26* (2013.01);
(Continued)

(58) Field of Classification Search
CPC .. G11C 8/08; G11C 5/145; G11C 7/12; G11C 11/4085; G11C 5/147
(Continued)

(56) References Cited

U.S. PATENT DOCUMENTS

| | | | |
|---|---|---|---|
| 7,248,096 | B2 | 7/2007 | Mensi |
| 7,317,347 | B2 | 1/2008 | Mensi |

(Continued)

FOREIGN PATENT DOCUMENTS

| | | |
|---|---|---|
| CN | 110149046 A | 8/2019 |
| CN | 209692611 U | 11/2019 |

(Continued)

*Primary Examiner* — Son T Dinh
(74) *Attorney, Agent, or Firm* — Winston Hsu (57) ABSTRACT

A charge pump circuit includes a power switch, a first pull-low circuit, an output pull-low circuit, a first charge pump stage and an output charge pump stage. The power switch receives an enabling signal. The first pull-low circuit and the output pull-low circuit receive a pull-low signal. The first charge pump stage includes a first boost capacitor used to receive a first phase signal, a first transfer transistor, a first gate-control transistor and a first storage capacitor used to receive a second phase signal. The output charge pump stage includes an output boost capacitor used to receive a third phase signal, an output transfer transistor and an output gate-control transistor. The charge pump circuit generates voltages in an erasing operation, a program operation and a read operation according to the enabling signal, the pull-low signal, the first phase signal, the second phase signal and the third phase signal.

20 Claims, 7 Drawing Sheets

(51) Int. Cl.
*G11C 16/14* (2006.01)
*G11C 16/04* (2006.01)
*G11C 16/26* (2006.01)
*G11C 16/30* (2006.01)
*H02M 3/07* (2006.01)
*H10B 41/10* (2023.01)
*H10B 41/30* (2023.01)

(52) U.S. Cl.
CPC ............ *G11C 16/30* (2013.01); *H02M 3/073* (2013.01); *H10B 41/10* (2023.02); *H10B 41/30* (2023.02)

(58) Field of Classification Search
USPC ..................................................... 365/189.11
See application file for complete search history.

(56) References Cited

U.S. PATENT DOCUMENTS

| | | | |
|---|---|---|---|
| 8,274,322 B2 | 9/2012 | Chang | |
| 2004/0263238 A1 | 12/2004 | Thorp | |
| 2006/0067154 A1* | 3/2006 | Bedeschi | ............... G11C 8/08 365/230.06 |
| 2013/0063118 A1* | 3/2013 | Nguyen | ............... G11C 5/145 323/304 |

FOREIGN PATENT DOCUMENTS

| | | |
|---|---|---|
| TW | I692927 B | 5/2020 |
| TW | 202029628 A | 8/2020 |

* cited by examiner

CHARGE PUMP CIRCUIT CAPABLE OF GENERATING VOLTAGES IN ERASING OPERATION, PROGRAM OPERATION AND READ OPERATION

CROSS REFERENCE TO RELATED APPLICATIONS

This non-provisional application claims priority of U.S. patent application No. 63/065,512, filed on 14 Aug. 2020, included herein by reference in its entirety.

BACKGROUND OF THE INVENTION

1. Field of the Invention

The invention relates to electronic circuits, and in particular, to a charge pump circuit capable of generating voltages in an erasing operation, a program operation and a read operation.

2. Description of the Prior Art

A charge pump circuit is an electronic circuit for boosting a lower voltage to a higher voltage. Charge pump circuits form an essential part in non-volatile memory devices such as flash memories. For example, a charge pump circuit is utilized in a flash memory to provide different voltages for an erasing operation, a program operation and a read operation. As the voltage for use in the erasing operation is much higher than the program operation and the read operation, the flash memory also employs level shift circuits and power switches to cover the wide range of voltage generation. Nevertheless, the level shift circuits and the power switches take up large circuit space, being unfavorable for the size reduction of the charge pump circuit.

SUMMARY OF THE INVENTION

According to an embodiment of the invention, a charge pump circuit generates a first voltage in an erasing operation, a second voltage in a program operation or a third voltage in a read operation. The charge pump circuit includes a power switch, a first pull-low circuit, an output pull-low circuit, a first charge pump stage and an output charge pump stage. The power switch includes a first terminal configured to receive an input voltage, a second terminal and a control terminal configured to receive an enabling signal. The first pull-low circuit includes a first terminal and a second terminal. The output pull-low circuit includes a first terminal configured to receive a pull-low signal, and a second terminal. The first charge pump stage includes a first boost capacitor, a first transfer transistor, a first gate-control transistor and a first storage capacitor. The first boost capacitor includes a first terminal configured to receive a first phase signal, and a second terminal. The first transfer transistor includes a first terminal coupled to the second terminal of the power switch, a second terminal, and a control terminal coupled to the second terminal of the first boost capacitor. The first gate-control transistor includes a first terminal coupled to the control terminal of the first transfer transistor, a second terminal coupled to the second terminal of the first transfer transistor, and a control terminal coupled to the second terminal of the power switch. The first storage capacitor includes a first terminal configured to receive a second phase signal, and a second terminal coupled to the second terminal of the first transfer transistor. The output charge pump stage includes an output boost capacitor, an output transfer transistor and an output gate-control transistor. The output boost capacitor includes a first terminal configured to receive a third phase signal, and a second terminal. The output transfer transistor includes a first terminal coupled to the second terminal of the first storage capacitor, a second terminal configured to output the first voltage, the second voltage or the third voltage, and a control terminal coupled to the second terminal of the output boost capacitor and the second terminal of the output pull-low circuit. The output gate-control transistor includes a first terminal coupled to the control terminal of the output transfer transistor, a second terminal coupled to the second terminal of the output transfer transistor, and a control terminal coupled to the second terminal of the first storage capacitor.

According to another embodiment of the invention, a charge pump circuit generates a first voltage in an erasing operation, a second voltage in a program operation or a third voltage in a read operation. The charge pump circuit includes a power switch, a first pull-low circuit, an output pull-low circuit, a first charge pump stage and an output charge pump stage. The power switch includes a first terminal configured to receive an input voltage, a second terminal and a control terminal configured to receive an enabling signal. The first pull-low circuit includes a first terminal configured to receive a pull-low signal, and a second terminal. The second pull-low circuit includes a first terminal configured to receive the pull-low signal, and a second terminal. The output pull-low circuit includes a first terminal configured to receive the pull-low signal, and a second terminal. The first charge pump stage includes a first boost capacitor, a first transfer transistor, a first gate-control transistor and a first storage capacitor. The first boost capacitor includes a first terminal configured to receive a fourth phase signal, and a second terminal. The first transfer transistor includes a first terminal coupled to the second terminal of the power switch, a second terminal, and a control terminal coupled to the second terminal of the first boost capacitor and the second terminal of the first pull-low circuit. The first gate-control transistor includes a first terminal coupled to the control terminal of the first transfer transistor, a second terminal coupled to the second terminal of the first transfer transistor, and a control terminal coupled to the second terminal of the power switch. The first storage capacitor includes a first terminal configured to receive a third phase signal, and a second terminal coupled to the second terminal of the first transfer transistor. The second charge pump stage includes a second boost capacitor, a second transfer transistor, a second gate-control transistor and a second storage capacitor. The second boost capacitor includes a first terminal configured to receive a first phase signal, and a second terminal. The second transfer transistor includes a first terminal coupled to the second terminal of the first storage capacitor, a second terminal, and a control terminal coupled to the second terminal of the second boost capacitor and the second terminal of the second pull-low circuit. The second gate-control transistor includes a first terminal coupled to the control terminal of the second transfer transistor, a second terminal coupled to the second terminal of the second transfer transistor, and a control terminal coupled to the second terminal of the first storage capacitor. The second storage capacitor includes a first terminal configured to receive a second phase signal, and a second terminal coupled to the second terminal of the second transfer transistor. The output charge pump stage includes an output boost capacitor, an output transfer transistor and an output gate-control transistor. The output boost capacitor includes a first terminal configured to receive a third phase signal, and a second terminal. The output transfer transistor includes a first terminal coupled to the second terminal of the first storage capacitor, a second terminal configured to output the first voltage, the second voltage or the third voltage, and a control terminal coupled to the second terminal of the output boost capacitor and the second terminal of the output pull-low circuit. The output gate-control transistor includes a first terminal coupled to the control terminal of the output transfer transistor, a second terminal coupled to the second terminal of the output transfer transistor, and a control terminal coupled to the second terminal of the first storage capacitor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
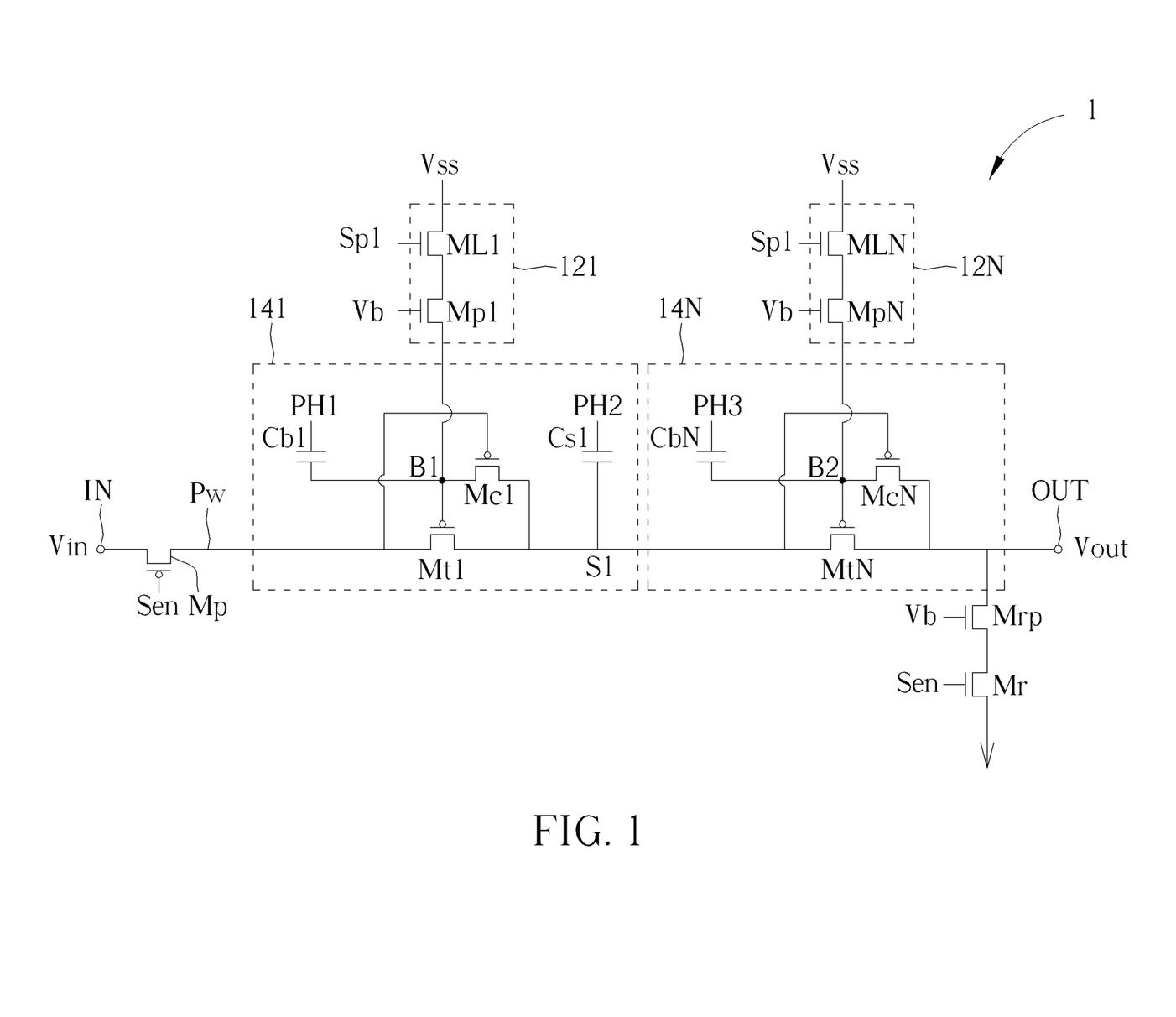
FIG. 1 is a circuit schematic of a charge pump circuit according to an embodiment of the invention.

FIG. 1 is a circuit schematic of a charge pump circuit 1 according to an embodiment of the invention. The charge pump circuit 1 may generate output voltages Vout for read, program and erasing operations of a non-volatile memory, and may output the different voltages Vout to a memory array to perform the read, program and erasing operations. The non-volatile memory may be a flash memory or an EEPROM memory.

The charge pump circuit 1 may include a power switch Mp, a pull-low circuit 121, a pull-low circuit 12N, a charge pump stage 141, an output charge pump stage 14N, a read protection transistor Mrp and a read transistor Mr.

The power switch Mp includes a first terminal configured to receive an input voltage Vin from an input node IN, a second terminal and a control terminal configured to receive an enabling signal Sen. The input voltage Vin may be a direct current (DC) voltage. The second terminal of the power switch Mp may be coupled to a power node Pw.

The pull-low circuit 121 includes a first terminal configured to receive a pull-low signal Spl, and a second terminal. The pull-low circuit 12N includes a first terminal configured to receive the pull-low signal Spl, and a second terminal. When the pull-low signal Spl is set to the voltage "Vin", the pull-low circuit 121 may couple the charge pump stage 141 to a ground terminal Vss, and the pull-low circuit 12N may couple the output charge pump stage 14N to the ground terminal Vss. When the pull-low signal Spl is set to 0V, the pull-low circuit 121 may disconnect the charge pump stage 141 from the ground terminal Vss, and the pull-low circuit 12N may disconnect the output charge pump stage 14N from the ground terminal Vss. The ground terminal Vss may provide a ground voltage, e.g., 0V. In some embodiments, the pull-low signal Spl may be set to a high voltage other than voltage "Vin". The high voltage is sufficiently high to turn on the pull-low circuit 121 and pull-low circuit 12N.

In some embodiments, the pull-low circuit 121 may include a pull-low transistor ML1 and a protection transistor Mp1. The pull-low transistor ML1 includes a first terminal coupled to the ground terminal Vss, a second terminal, and a control terminal configured to receive the pull-low signal Spl. The protection transistor Mp1 includes a first terminal coupled to the second terminal of the pull-low transistor ML1, a second terminal coupled to the control terminal of the transfer transistor Mt1, and a control terminal configured to receive a bias voltage Vb. The protection transistor Mp1 may limit the voltage at the first terminal thereof to a voltage (Vb-Vt), protecting the pull-low transistor ML1 from being damaged by a high voltage, Vt being a threshold voltage of the protection transistor Mp1. The pull-low transistor ML1 may control the connection between the first terminal of the protection transistor Mp1 and the ground terminal Vss. The protection transistor Mp1 may be a high voltage NMOS transistor, and the pull-low transistor ML1 may be a normal 5V NMOS transistor. The bias voltage Vb may be the input voltage Vin.

Similarly, the pull-low circuit 12N may include a pull-low transistor MLN and a protection transistor MpN. The output pull-low transistor MLN includes a first terminal coupled to the ground terminal Vss, a second terminal, and a control terminal configured to receive the pull-low signal Spl. The protection transistor MpN includes a first terminal coupled to the second terminal of the output pull-low transistor MLN, a second terminal coupled to the control terminal of the transfer transistor MtN, and a control terminal configured to receive the bias voltage Vb. The protection transistor MpN may limit the voltage at the first terminal thereof to a voltage (Vb-Vt), protecting the pull-low transistor MLN from being damaged by a high voltage, Vt being a threshold voltage of the protection transistor MpN. The pull-low transistor MLN may control the connection between the first terminal of the protection transistor MpN and the ground terminal Vss. The protection transistor MpN may be a high voltage N-type transistor, and the pull-low transistor MLN may be a normal 5V N-type transistor.

The charge pump stage 141 includes a boost capacitor Cb1, a transfer transistor Mt1, a gate-control transistor Mc1 and a storage capacitor Cs1. The boost capacitor Cb1 includes a first terminal configured to receive a phase signal PH1, and a second terminal. The transfer transistor Mt1 includes a first terminal coupled to the second terminal of the power switch Mp, a second terminal, and a control terminal coupled to the second terminal of the boost capacitor Cb1. The gate-control transistor Mc1 includes a first terminal coupled to the control terminal of the transfer transistor Mt1, a second terminal coupled to the second terminal of the transfer transistor Mt1, and a control terminal coupled to the second terminal of the power switch Mp. The storage capacitor Cs1 includes a first terminal configured to receive a phase signal PH2, and a second terminal coupled to the second terminal of the transfer transistor Mt1. The control terminal of the transfer transistor Mt1 may be coupled to a bias node B1. When the phase signal PH1 is set to 0V, the voltage at the bias node B1 may be (Vin-Vt), where Vt is the threshold voltage of the gate-control transistor Mc1. The second terminal of the storage capacitor Cs1 may be coupled to a storage node S1. The transfer transistor Mt1 and the gate-control transistor Mc1 may be P-type transistors. The boost capacitor Cb1 and the storage capacitor Cs1 may be implemented by transistors.

The output charge pump stage 14N includes a boost capacitor CbN, a transfer transistor MtN and a gate-control transistor McN. The boost capacitor CbN includes a first terminal configured to receive a phase signal PH3, and a second terminal. The transfer transistor MtN includes a first terminal coupled to the second terminal of the storage capacitor Cs1, a second terminal configured to output the first voltage, the second voltage or the third voltage, and a control terminal coupled to the second terminal of the boost capacitor CbN and the second terminal of the pull-low circuit 12N. The gate-control transistor McN includes a first terminal coupled to the control terminal of the transfer transistor MtN, a second terminal coupled to the second terminal of the transfer transistor MtN, and a control terminal coupled to the second terminal of the storage capacitor Cs1. The control terminal of the transfer transistor MtN may be coupled to a bias node B2. When the phase signal PH3 is set to 0V, the voltage at the bias node B2 may be (2Vin-Vt), where Vt is the threshold voltage of the gate-control transistor McN. The second terminal of the transfer transistor MtN may be coupled to an output node OUT. The transfer transistor MtN and the gate-control transistor McN may be P-type transistors. The boost capacitor CbN may be implemented by a transistor. The capacitances of the boost capacitors Cb1 and CbN may be sufficient to meet the requirement of the safe operating area (SOA). The capacitance of the storage capacitor Cs1 is greater than the capacitance of the boost capacitor CbN, and the capacitance of the boost capacitor CbN is greater than or equal to the capacitance of the boost capacitor Cb1.

The read protection transistor Mrp includes a first terminal coupled to the second terminal of the transfer transistor MtN, a second terminal, and a control terminal configured to receive the bias voltage Vb. The read transistor Mr includes a first terminal coupled to the second terminal of the read protection transistor Mrp, a second terminal, and a control terminal configured to receive the enabling signal Sen. The read protection transistor Mrp may limit the voltage at the first terminal thereof to a voltage (Vb-Vt), protecting the read transistor Mr from being damaged by a high voltage, Vt being a threshold voltage of the read protection transistor Mrp. The read transistor Mr may control the connection between the second terminal of the read protection transistor Mrp and the ground terminal Vss. The read protection transistor Mrp may be a high voltage NMOS transistor, and the read transistor Mr may be a normal 5V NMOS transistor.

Figure 2A:
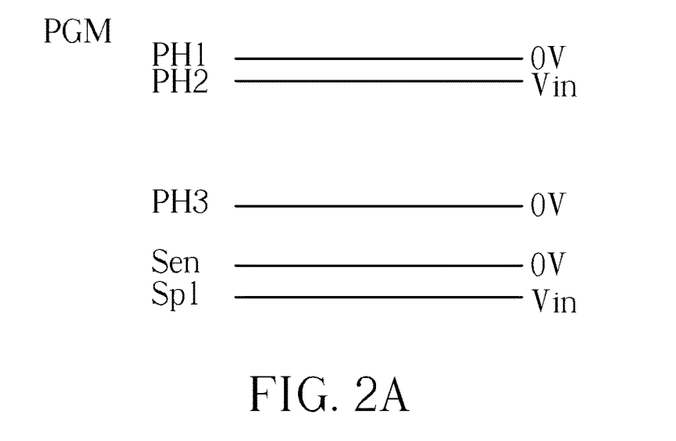
FIGS. 2A, 2B and 2C show waveforms of the charge pump circuit in FIG. 1 in a program operation, a read operation and an erasing operation, respectively.
Figure 2B:
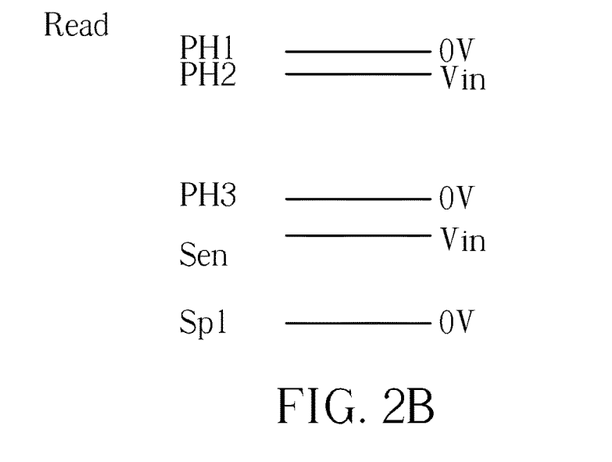
Figure 2C:
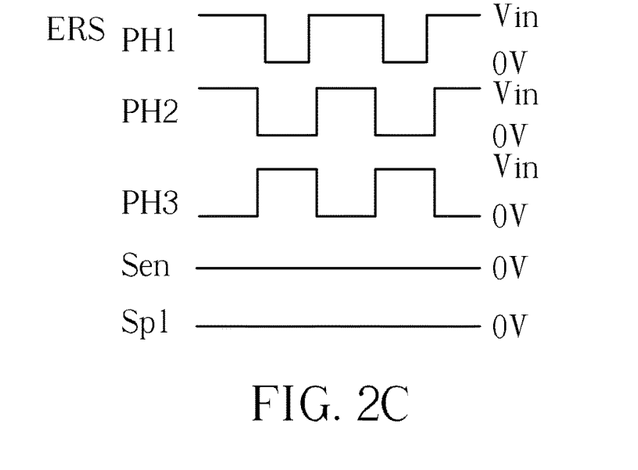

The enabling signal Sen, the pull-low signal Spl and the phase signals PH1 to PH3 may be set to operate the charge pump circuit 1 for generating output voltages Vout in the read, program and erasing operations. FIGS. 2A, 2B and 2C show waveforms of the charge pump circuit 1 in a program operation, a read operation and an erasing operation, respectively.

Referring to FIG. 2A, in the program operation, the enabling signal Sen is set to 0V, the pull-low signal Spl is set to the voltage "Vin", the phase signal PH1 is set to 0V, the phase signal PH2 is set to the voltage "Vin" and the phase signal PH3 is set to 0V. The enabling signal Sen turns on the power switch Mp and turns off the read transistor Mr, the pull-low signal Spl enables the pull-low circuit 121 to couple the control terminal of the transfer transistor Mt1 to the ground terminal Vss to turn on the transfer transistor Mt1, and the pull-low signal Spl enables the pull-low circuit 12N to couple the control terminal of the transfer transistor MtN to the ground terminal Vss to turn on the transfer transistor MtN, propagating the input voltage Vin along the power switch Mp, the transfer transistor Mt1 and the transfer transistor MtN to generate the output voltage Vout at the output node OUT. The phase signal PH1, the phase signal PH2 and the phase signal PH3 are held at substantially constant levels, so as not to raise the input voltage Vin to generate the output voltage Vout. Both the input voltage Vin and the output voltage Vout may be 9V. While specific voltage levels are assigned to the phase signals PH1 to PH3, the phase signals PH1 to PH3 may be set to other constant voltage levels. Further, while the voltage "Vin" is used to set the pull-low signal Spl and the phase signal PH2, a voltage different from the voltage "Vin" may be used to replace the voltage "Vin", and different voltages may be used to set the pull-low signal Spl and the phase signal PH2.

Referring to FIG. 2B, in the read operation, the enabling signal Sen is set to the voltage "Vin", the pull-low signal Spl is set to 0V, the phase signal PH1 is set to 0V, the phase signal PH2 is set to the voltage "Vin" and the phase signal PH3 is set to 0V. The enabling signal Sen turns off the power switch Mp and turns on the read transistor Mr, The pull-low signal Spl enables the pull-low circuit 121 to disconnect the control terminal of the transfer transistor Mt1 from the ground terminal Vss, and the phase signal PH1 turns off the transfer transistor Mt1. Likewise, the pull-low signal Spl enables the pull-low circuit 12N to disconnect the control terminal of the transfer transistor MtN from the ground terminal Vss, and the phase signal PH3 turns off the transfer transistor MtN. In this manner, the input voltage Vin is prevented from propagating along the power switch Mp, the transfer transistor Mt1 and the transfer transistor MtN to the output node OUT, and the output voltage Vout is generated by the read transistor Mr. While specific voltage levels are assigned to the phase signals PH1 to PH3, the phase signals PH1 to PH3 may be set to other constant voltage levels. Further, while the voltage "Vin" is used to set the enabling signal Sen and the phase signal PH2, a voltage different from the voltage "Vin" may be used to replace the voltage "Vin", and different voltages may be used to set the enabling signal Sen and the phase signal PH2.

Referring to FIG. 2C, in the erasing operation, the enabling signal Sen is set to 0V, the pull-low signal Spl is set to 0V, the phase signals PH1 to PH3 are toggled continuously. The enabling signal Sen turns on the power switch Mp and turns off the read transistor Mr. The pull-low signal Spl enables the pull-low circuit 121 to disconnect the control terminal of the transfer transistor Mt1 from the ground terminal Vss, and the phase signal PH1 controls the transfer transistor Mt1 to transfer charges from the power node Pw to the storage capacitor Cs1. Likewise, the pull-low signal Spl enables the pull-low circuit 12N to disconnect the control terminal of the transfer transistor MtN from the ground terminal Vss, and the phase signal PH3 controls the transfer transistor MtN to transfer charges from the storage capacitor Cs1 to the output node OUT. In this manner, the input voltage Vin may be propagated along the power switch Mp, the transfer transistor Mt1 and the transfer transistor MtN to generate the output voltage Vout at the output node OUT. The phase signals PH1 to PH3 are toggled continuously to raise the input voltage Vin to generate the output voltage Vout. The input voltage Vin may be 9V, and the output voltage Vout may be 17.3V. The phase signal PH2 and the phase signal PH3 are anti-phase. A falling edge of a pulse in the phase signal PH1 lags a falling edge of a pulse in the phase signal PH2, and a rising edge of the pulse in the phase signal PH1 leads a rising edge of the pulse in the phase signal PH2. While the phase signals PH1 to PH3 are toggled between the voltage "Vin" and 0V, a voltage different from the voltage "Vin" may be used to replace the voltage "Vin".

Figure 3:
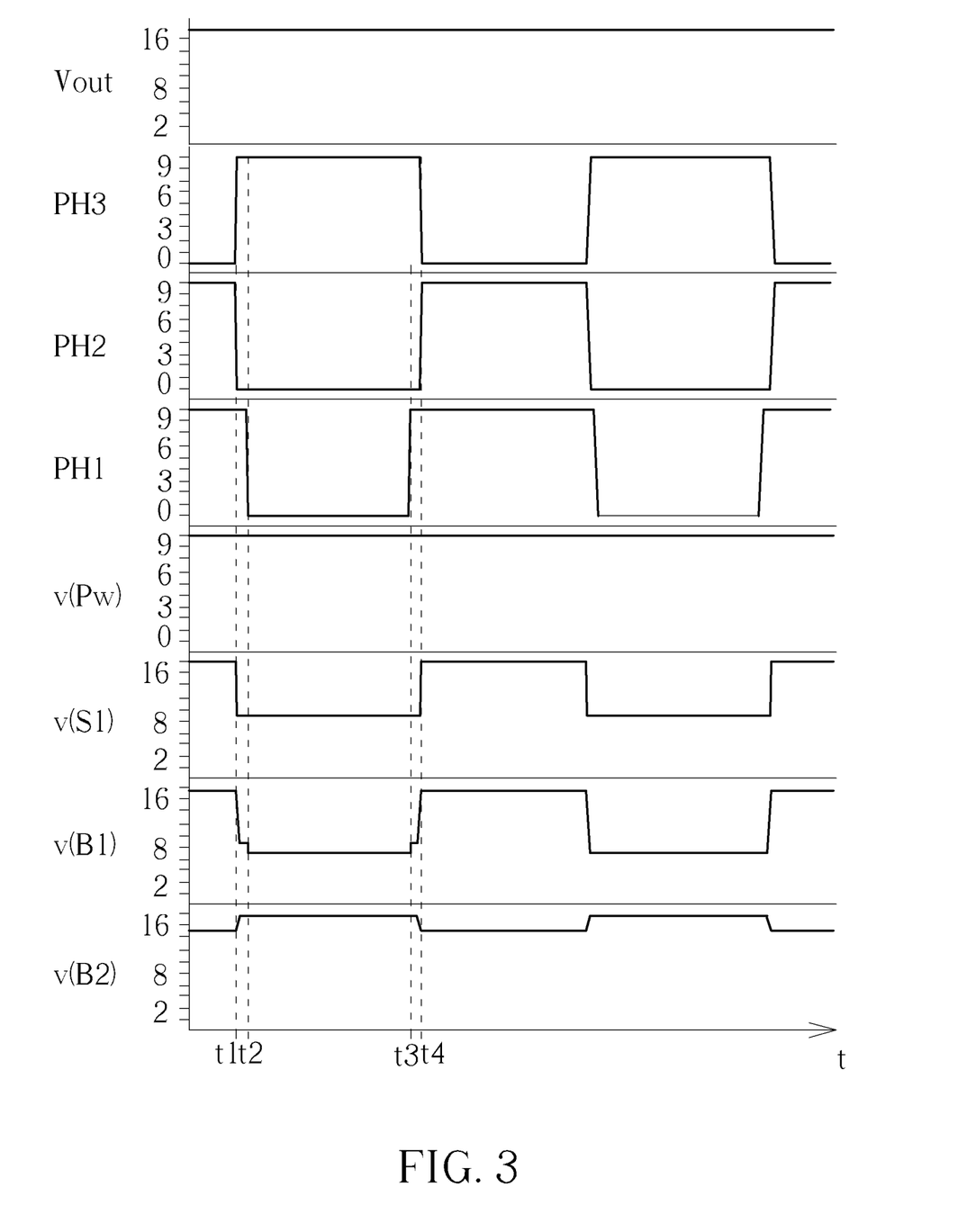
FIG. 3 shows waveforms of the charge pump circuit in FIG. 1 in the erasing mode.

FIG. 3 shows detailed waveforms of the charge pump circuit in FIG. 1 in the erasing mode.

At Time t1, the power switch Mp is turned on to generate a voltage v(Pw) equal to the input voltage Vin at the power node Pw. The phase signal PH1 is set to the voltage "Vin" and the phase signal PH2 is switched to at 0V, driving the voltage v(B1) at the bias node B1 to (Vin). Since the voltage v(B1) is equal to the voltage v(Pw) (Vin=Vin), the transfer transistor Mt1 is turned off, stopping charges from being transferred from the power node Pw to the storage node S1.

At Time t2, the phase signal PH1 is switched to 0V and the phase signal PH2 remains at 0V, and the voltage v(B1) drops to (Vin-Vt), where Vt is the threshold voltage of the transfer transistor Mt1, turning on the transfer transistor Mt1, establishing a voltage v(S1) equal to Vin at the storage node S1. The phase signal PH3 is set to the voltage "Vin", and the voltage v(B2) rises to (2Vin), turning off the transfer transistor MtN, and stopping charges from being transferred from the storage node S1 to the output node OUT.

At Time t3, the phase signal PH1 is switched to the voltage "Vin" and the phase signal PH2 remains at 0V, boosting the voltage v(B1) to (Vin). Since the voltage v(B1) is equal to the voltage v(Pw), the transfer transistor Mt1 is turned off, preventing a reversal current fed back from the storage node S1 to the power node Pw.

At Time t4, the phase signal PH1 remains at the voltage "Vin" and the phase signal PH2 is switched to the voltage "Vin", boosting the voltage v(S1) 2Vin. Since the voltage v(Pw) is less than the voltage v(S1) (Vin<2Vin), the gate-control transistor Mc1 is turned on, the voltage v(B1) becomes to 2Vin, and the transfer transistor Mt1 is turned off. The phase signal PH3 is set to 0V, and the voltage v(B2) at the bias node VB2 drops to (2Vin-Vt). Since the voltage v(S1) is higher than the voltage v(B2) (2Vin>(2Vin-Vt)), the gate-control transistor McN is turned off. Since the voltage v(B2) is less than the voltage v(S1) ((2Vin-Vt)<2Vin), the transfer transistor MtN is turned on, transferring charges from the storage node S1 to the output node OUT to generate an output voltage Vout equal to 2Vin.

In the charge pumping process outlined in FIG. 3, the input voltage Vin may be pumped to generate the output voltage Vout equal to 2Vin.

The charge pump circuit 1 can generate voltages for the program operation, the read operation and the erasing operation according to the enabling signal Sen, the pull-low signal Spl and the phase signals PH1 to PH3 without utilizing other power switches and level shift circuits, reducing circuit size and saving manufacturing costs.

Figure 6:
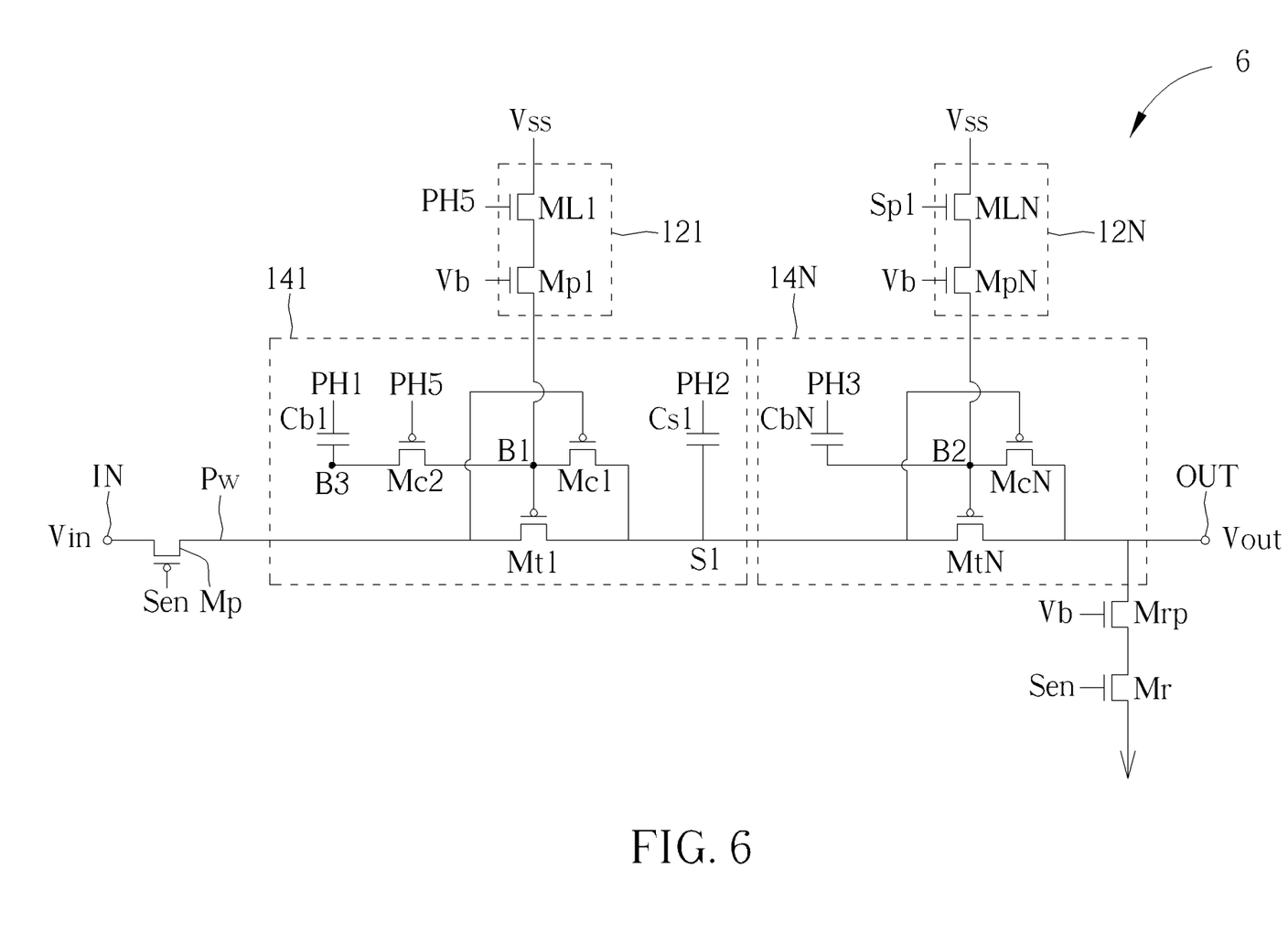
FIG. 6 is a circuit schematic of a charge pump circuit according to another embodiment of the invention.

FIG. 6 is a circuit schematic of a charge pump circuit 6 according to another embodiment of the invention. The configuration of the charge pump circuit 6 is similar to the charge pump circuit 1, except that a gate-control transistor Mc2 is further included in the charge pump stage 141 of the charge pump circuit 6, and the pull-low circuit 121 employs a different signal configuration. The following discussion will focus on the gate-control transistor Mc2 and the pull-low circuit 121, and the explanation for the other components can be found in the preceding paragraphs and will be omitted here for brevity. The gate-control transistor Mc2 includes a first terminal coupled to the second terminal of the boost capacitor Cb1, a second terminal coupled to the control terminal of the transfer transistor Mt1, and a control terminal configured to receive a phase signal PH5. The control terminal of the transfer transistor Mt1 may be coupled to a bias node B1. The second terminal of the boost capacitor Cb1 is coupled to a bias node B3. The gate-control transistor Mc2 may be a P-type transistor. The first terminal of the pull-low circuit 121 may receive the phase signal PH5, and the control terminal of the pull-low transistor ML1 may receive the phase signal PH5.

The signal configurations for the program operation and the read operation are identical to the charge pump circuit 1, and the signal configuration of the enabling signal Sen and the pull-low signal Spl for the erasing operation of the charge pump circuit 6 is identical to charge pump circuit 1, and explanation therefor will be omitted here for brevity. The signal configuration of the phase signals PH1 to PH3 and PH5 for the erasing operation of the charge pump circuit 6 is explained with the accompanying FIG. 7.

Figure 7:
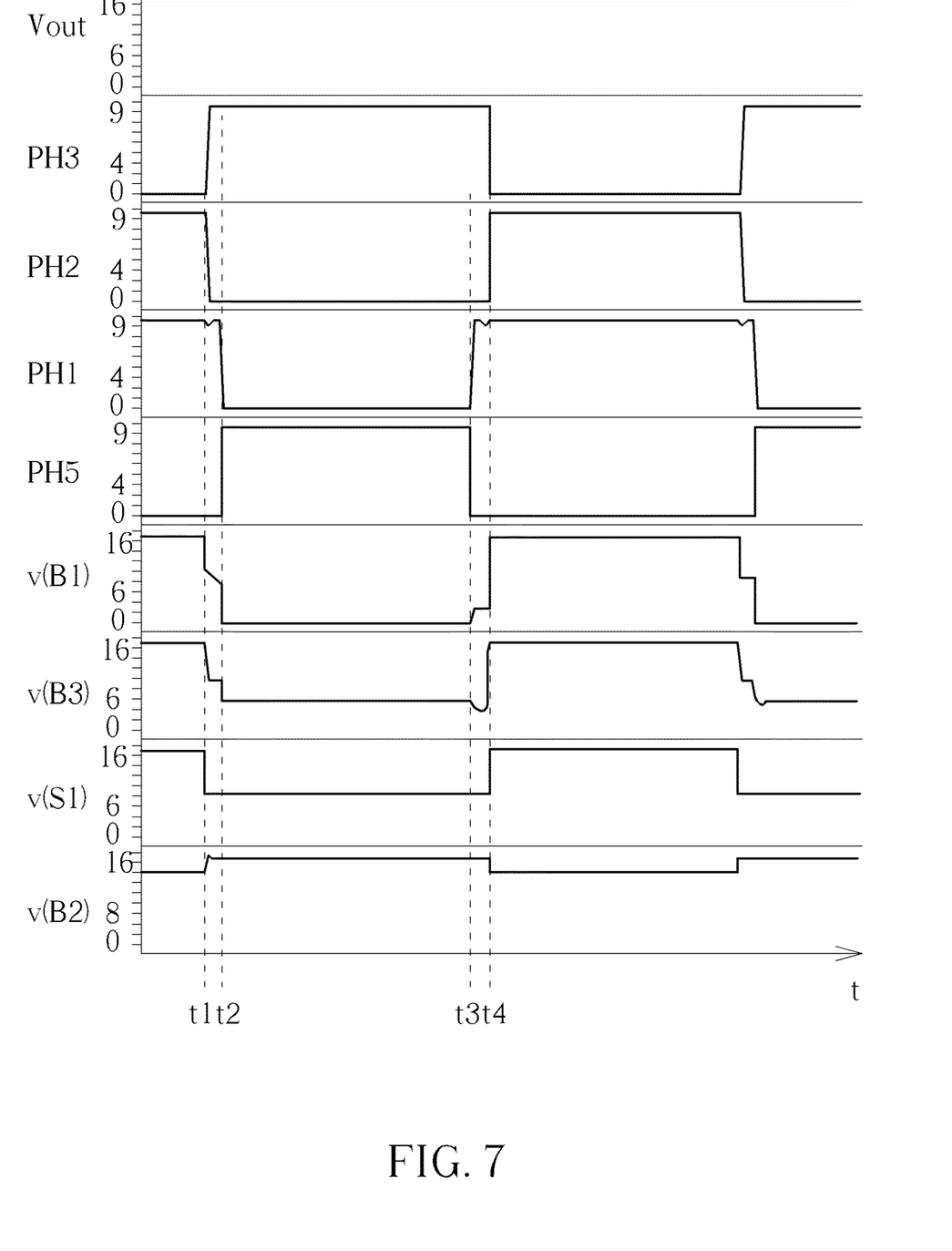
FIG. 7 shows waveforms of the charge pump circuit in FIG. 6 in the erasing mode.

Referring to FIG. 7, in the erasing operation, the phase signals PH1 to PH3 and PH5 are toggled continuously. The phase signal PH2 and the phase signal PH3 are anti-phase, and the phase signal PH1 and the phase signal PH5 are anti-phase. A falling edge of a pulse in the phase signal PH1 lags a falling edge of a pulse in the phase signal PH2, and a rising edge of the pulse in the phase signal PH1 leads a rising edge of the pulse in the phase signal PH2. While the phase signals PH1 to PH3 and PH5 are toggled between the voltage "Vin" and 0V, a voltage different from the voltage "Vin" may be used to replace the voltage "Vin".

At Time t1, the phase signal PH1 is switched from Vin to the voltage "Vin", the phase signal PH2 is set to 0V, and the phase signal PH5 is set to 0V, turning on the gate-control transistor Mc2 and turning off the pull-low circuit 121, and driving the voltage v(B1) from 2Vin to Vin. Since the voltage v(B1) is equal to the voltage v(Pw) ((Vin=Vin), the transfer transistor Mt1 is turned off, stopping charges from being transferred from the power node Pw to the storage node S1.

At Time t2, the phase signal PH1 is switched to 0V, the phase signal PH2 remains at 0V, the phase signal PH5 is switched to the voltage "Vin", turning off the gate-control transistor Mc2 and turning on the pull-low circuit 121, thereby switching the voltage v(B1) to 0V, turning on the transfer transistor Mt1, and establishing a voltage v(S1) equal to Vin at the storage node S1. The 0V at the bias node B1 may fully turn on the transfer transistor Mt1. Consequently, while the gate-control transistor Mc2 may take certain circuit space in the charge pump circuit 6, the size of the transfer transistor Mt1 may be significantly reduced in comparison to the charge pump circuit 1, reducing parasitic capacitance at the storage node S1, leading to a considerable reduction in the size of the transistor Cs1, thereby reducing the overall circuit size while providing the same magnitude of current.

At Time t3, the phase signal PH1 is switched to the voltage "Vin", the phase signal PH2 remains at 0V, and the phase signal PH5 is switched to 0V, turning on the gate-control transistor Mc2 and turning off the pull-low circuit 121, boosting the voltage v(B1) to (Vin). The transfer transistor Mt1 is turned off, preventing a reversal current fed back from the storage node S1 to the power node Pw.

At Time t4, the phase signal PH1 remains at the voltage "Vin" and the phase signal PH2 is switched to the voltage "Vin", and the phase signal PH5 remains at 0V, boosting the voltage v(S1) to 2Vin. The phase signal PH3 is set to 0V, and the voltage v(B2) at the bias node VB2 drops to (2Vin-Vt). Since the voltage v(S1) is higher than the voltage v(B2) (2Vin>(2Vin-Vt)), the gate-control transistor McN is turned off. Since the voltage v(B2) is less than the voltage v(S1) ((2Vin−Vt)<2Vin), the transfer transistor MtN is turned on, transferring charges from the storage node S1 to the output node OUT to generate an output voltage Vout equal to 2Vin.

In the charge pumping process provided in FIG. 7, the input voltage Vin may be pumped to generate the output voltage Vout equal to 2Vin.

The charge pump circuit 6 can generate voltages for the program operation, the read operation and the erasing operation according to the enabling signal Sen, the pull-low signal Spl and the phase signals PH1 to PH3 and PH5 without utilizing other power switches and level shift circuits, significantly reducing circuit size and saving manufacturing costs.

Figure 4:
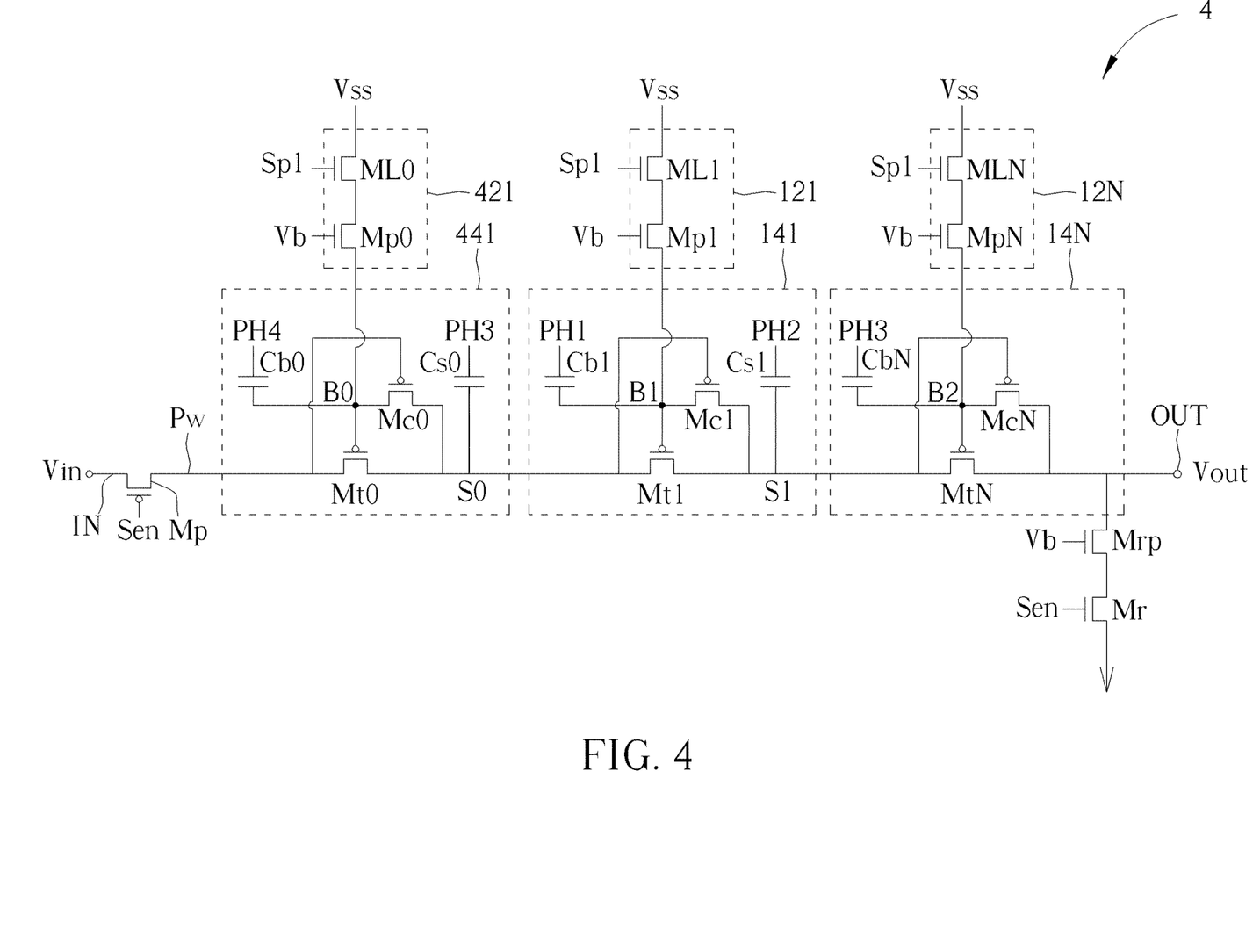
FIG. 4 is a circuit schematic of a charge pump circuit according to another embodiment of the invention.

FIG. 4 is a circuit schematic of a charge pump circuit 4 according to another embodiment of the invention. The configuration of the charge pump circuit 4 is similar to the charge pump circuit 1, except that a pull-low circuit 421 and a charge pump stage 441 are further included in the charge pump circuit 4. The explanation for the charge pump circuit 4 will be focused on the pull-low circuit 421 and the charge pump stage 441, and the explanation for the other components can be found in the preceding paragraphs and will be omitted here for brevity. The charge pump stage 441 is coupled to the pull-low circuit 421, the power switch Mp and the charge pump stage 141.

The pull-low circuit 421 includes a first terminal configured to receive the pull-low signal Spl, and a second terminal. When the pull-low signal Spl is set to the voltage "Vin", the pull-low circuit 421 may couple the charge pump stage 441 to the ground terminal Vss. When the pull-low signal Spl is set to 0V, the pull-low circuit 421 may disconnect the charge pump stage 441 from the ground terminal Vss. The pull-low circuit 421 may include a pull-low transistor ML0 and a protection transistor Mp0. The pull-low transistor ML0 includes a first terminal coupled to the ground terminal Vss, a second terminal, and a control terminal configured to receive the pull-low signal Spl. The protection transistor Mp0 includes a first terminal coupled to the second terminal of the pull-low transistor ML0, a second terminal coupled to the control terminal of the transfer transistor Mt0, and a control terminal configured to receive the bias voltage Vb. The protection transistor Mp0 may limit the voltage at the first terminal thereof to a voltage (Vb−Vt), protecting the pull-low transistor ML0 from being damaged by a high voltage, Vt being a threshold voltage of the protection transistor Mp0. The pull-low transistor ML0 may control the connection between the first terminal of the protection transistor Mp0 and the ground terminal Vss. The protection transistor Mp0 may be a high voltage N-type transistor, and the pull-low transistor ML0 may be a normal 5V N-type transistor.

The charge pump stage 441 includes a boost capacitor Cb0, a transfer transistor Mt0, a gate-control transistor Mc0 and a storage capacitor Cs0. The boost capacitor Cb0 includes a first terminal configured to receive a phase signal PH4, and a second terminal. The transfer transistor Mt0 includes a first terminal coupled to the second terminal of the power switch Mp, a second terminal, and a control terminal coupled to the second terminal of the boost capacitor Cb0. The gate-control transistor Mc0 includes a first terminal coupled to the control terminal of the transfer transistor Mt0, a second terminal coupled to the second terminal of the transfer transistor Mt0, and a control terminal coupled to the second terminal of the power switch Mp. The storage capacitor Cs0 includes a first terminal configured to receive the phase signal PH3, and a second terminal coupled to the second terminal of the transfer transistor Mt0. The control terminal of the transfer transistor Mt0 may be coupled to a bias node B0. The second terminal of the storage capacitor Cs0 may be coupled to a storage node S0. When the phase signal PH4 is set to 0V, the voltage at the bias node B0 may be (Vin); when the phase signal PH1 is set to 0V, the voltage at the bias node B1 may be (2Vin); and when the phase signal PH3 is set to 0V, the voltage at the bias node B2 may be (3Vin). The transfer transistor Mt0 and the gate-control transistor Mc0 may be P-type transistors. The boost capacitor Cb0 and the storage capacitor Cs0 may be implemented by transistors. The capacitance of the storage capacitor Cs0 is greater than the capacitance of the boost capacitor Cb0. The capacitance of the boost capacitor CbN is greater than or equal to the capacitance of the boost capacitor Cb0.

The enabling signal Sen, the pull-low signal Spl and the phase signals PH1 to PH4 may be set to operate the charge pump circuit 4 for generating output voltages Vout in the read, program and erasing operations.

In the program operation, the enabling signal Sen is set to 0V, the pull-low signal Spl is set to the voltage "Vin", the phase signal PH1 may be set to 0V, the phase signal PH2 may be set to the voltage "Vin", the phase signal PH3 may be set to 0V, and the phase signal PH4 may be set to the voltage "Vin". The enabling signal Sen turns on the power switch Mp, and the pull-low signal Spl enables the pull-low circuit 421 to couple the transfer transistor Mt0 to the ground terminal Vss, the pull-low circuit 121 to couple the transfer transistor Mt1 to the ground terminal Vss, and the pull-low circuit 12N to couple the transfer transistor MtN to the ground terminal Vss. In this manner, the input voltage Vin may be propagated along the power switch Mp, the transfer transistor Mt0, the transfer transistor Mt1 and the transfer transistor MtN to generate the output voltage Vout at the output node OUT. The phase signals PH1 to PH4 are held at substantially constant levels, so as not to raise the input voltage Vin to generate the output voltage Vout. While specific voltage levels are assigned to the phase signals PH1 to PH4, the phase signals PH1 to PH4 may be set to other constant voltage levels. Other configurations for the program operation of the charge pump circuit 4 are similar to the charge pump circuit 1, and explanation therefor can be found in the preceding paragraphs and will be omitted here for brevity.

In the read operation, the enabling signal Sen is set to the voltage "Vin", the pull-low signal Spl is set to 0V, the phase signal PH1 may be set to 0V, the phase signal PH2 may be set to the voltage "Vin", the phase signal PH3 may be set to 0V, and the phase signal PH4 may be set to the voltage "Vin". The enabling signal Sen turns off the power switch Mp and turns on the read transistor Mr, The pull-low signal Spl enables the pull-low circuits 421, 121, 12N to disconnect the control terminals of the transfer transistors Mt0, Mt1, MtN from a ground terminal Vss, and the phase signals PH4, PH1, PH3 turn off the transfer transistors Mt0, Mt1, MtN. In this manner, the input voltage Vin is prevented from propagating along the power switch Mp, the transfer transistor Mt0, the transfer transistor Mt1 and the transfer transistor MtN to the output node OUT, and the output voltage Vout is generated by the read transistor Mr. While specific voltage levels are assigned to the phase signals PH1 to PH4, the phase signals PH1 to PH4 may be set to other constant voltage levels. Further, while the voltage "Vin" is used to set the enabling signal Sen and the phase signals PH2 and PH4, a voltage different from the voltage "Vin" may be used to replace the voltage "Vin", and different voltages may be used to set the enabling signal Sen and the phase signals PH2 and PH4. Other configurations for the read operation of the charge pump circuit 4 are similar to the charge pump circuit 1, and explanation therefor can be found in the preceding paragraphs and will be omitted here for brevity.

The signal configuration of the enabling signal Sen and the pull-low signal Spl for the erasing operation of the charge pump circuit 4 is identical to the charge pump circuit 1, and explanation therefor can be found in the preceding paragraphs and will be omitted here for brevity. The signal configuration of the phase signals PH1 to PH4 for the erasing operation of the charge pump circuit 4 is explained with the accompanying FIG. 5.

Figure 5:
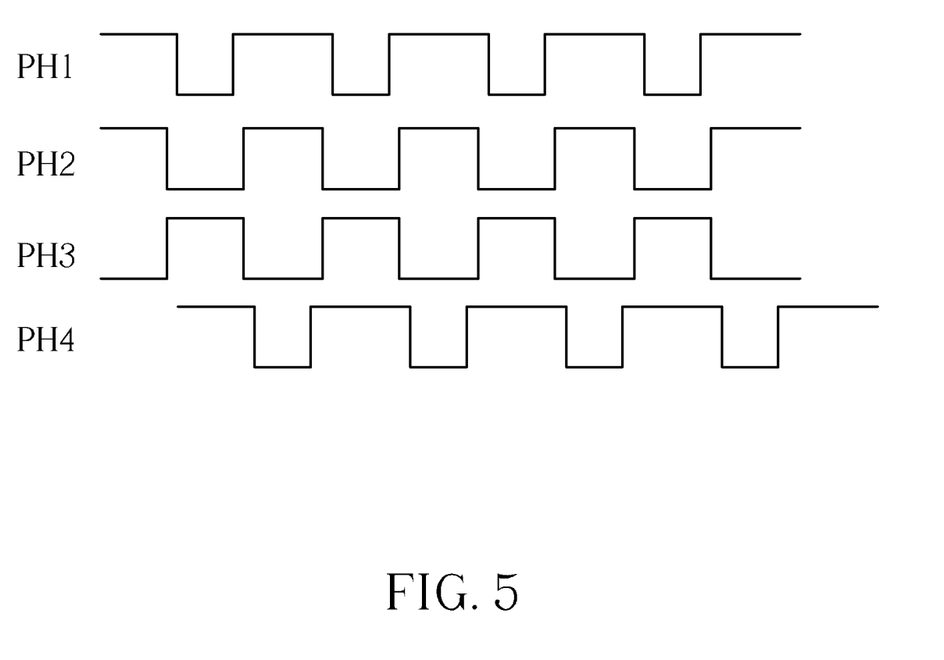
FIG. 5 shows waveforms of the charge pump circuit in FIG. 4 in the erasing mode.

Referring to FIG. 5, in the erasing operation, the phase signals PH1 to PH4 are toggled continuously. The phase signal PH4 controls the transfer transistor Mt0 to transfer charges from the power node Pw to the storage capacitor Cs0. In this manner, the input voltage Vin may be propagated along the power switch Mp, the transfer transistor Mt0, the transfer transistor Mt1 and the transfer transistor MtN to generate the output voltage Vout at the output node OUT. The phase signals PH1 to PH4 are toggled continuously to raise the input voltage Vin to generate the output voltage Vout. A falling edge of a pulse in the phase signal PH4 lags a falling edge of a pulse in the phase signal PH3, and a rising edge of the pulse in the phase signal PH4 leads a rising edge of the pulse in the phase signal PH3. The phase signal PH2 and the phase signal PH3 are anti-phase. A falling edge of a pulse in the phase signal PH1 lags a falling edge of a pulse in the phase signal PH2, and a rising edge of the pulse in the phase signal PH1 leads a rising edge of the pulse in the phase signal PH2. While the phase signals PH1 to PH4 are toggled between the voltage "Vin" and 0V, a voltage different from the voltage "Vin" may be used to replace the voltage "Vin".

In the charge pumping process outlined in FIG. 5, the input voltage Vin may be pumped to generate the output voltage Vout equal to 3Vin.

While 3 charge pump stages are employed in the embodiment, those skilled in the art may recognize that additional charge pump stages may be added to the charge pump circuit 4 by applying the similar principle, thereby boosting the output voltage Vout to an even higher level.

The charge pump circuit 4 can generate voltages for the program operation, the read operation and the erasing operation according to the enabling signal Sen, the pull-low signal Spl and the phase signals PH1 to PH4 without utilizing other power switches and level shift circuits, reducing circuit size, saving manufacturing costs and generating a very high voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charge pump circuit for generating a first voltage in an erasing operation, a second voltage in a program operation or a third voltage in a read operation, the charge pump circuit comprising:
   a power switch comprising a first terminal configured to receive an input voltage, a second terminal and a control terminal configured to receive an enabling signal;
   a first pull-low circuit comprising a first terminal and a second terminal;
   an output pull-low circuit comprising a first terminal configured to receive a pull-low signal, and a second terminal;
   a first charge pump stage comprising:
      a first boost capacitor comprising a first terminal configured to receive a first phase signal, and a second terminal;
      a first transfer transistor comprising a first terminal coupled to the second terminal of the power switch, a second terminal, and a control terminal coupled to the second terminal of the first boost capacitor and the second terminal of the first pull-low circuit;
      a first gate-control transistor comprising a first terminal coupled to the control terminal of the first transfer transistor, a second terminal coupled to the second terminal of the first transfer transistor, and a control terminal coupled to the second terminal of the power switch; and
      a first storage capacitor comprising a first terminal configured to receive a second phase signal, and a second terminal coupled to the second terminal of the first transfer transistor; and
   an output charge pump stage comprising:
      an output boost capacitor comprising a first terminal configured to receive a third phase signal, and a second terminal;
      an output transfer transistor comprising a first terminal coupled to the second terminal of the first storage capacitor, a second terminal configured to output the first voltage, the second voltage or the third voltage, and a control terminal coupled to the second terminal of the output boost capacitor and the second terminal of the output pull-low circuit; and
      an output gate-control transistor comprising a first terminal coupled to the control terminal of the output transfer transistor, a second terminal coupled to the second terminal of the output transfer transistor, and a control terminal coupled to the second terminal of the first storage capacitor.

2. The charge pump circuit of claim 1, wherein the first terminal of the first pull-low circuit is configured to receive the pull-low signal.

3. The charge pump circuit of claim 2, wherein:
   in the erasing operation, the first phase signal, the second phase signal and the third phase signal are toggled, the enabling signal turns on the power switch, and the pull-low signal enables the first pull-low circuit to disconnect the first transfer transistor from a ground terminal, and enables the output pull-low circuit to disconnect the output transfer transistor from the ground terminal.

4. The charge pump circuit of claim 3, wherein:
   the second phase signal and the third phase signal are anti-phase; and
   a falling edge of a pulse in the first phase signal lags a falling edge of a pulse in the second phase signal, and a rising edge of the pulse in the first phase signal leads a rising edge of the pulse in the second phase signal.

5. The charge pump circuit of claim 2, wherein:
   in the program operation, the first phase signal, the second phase signal and the third phase signal are substantially constant, and the enabling signal turns on the power switch, and the pull-low signal enables the first pull-low circuit to couple the control terminal of the first transfer transistor to a ground terminal, and enables the output pull-low circuit to couple the control terminal of the output transfer transistor to the ground terminal.

6. The charge pump circuit of claim 2, wherein:
in the read operation, the first phase signal, the second phase signal and the third phase signal are substantially constant, and the enabling signal turns off the power switch, and the pull-low signal enables the first pull-low circuit to disconnect the first transfer transistor from a ground terminal, and enables the output pull-low circuit to disconnect the output transfer transistor from the ground terminal.

7. The charge pump circuit of claim 1, wherein the power switch, the first transfer transistor, the first gate-control transistor, the output transfer transistor and the output gate-control transistor are P-type transistors.

8. The charge pump circuit of claim 1, wherein a capacitance of the first storage capacitor is greater than a capacitance of the output boost capacitor, and the capacitance of the output boost capacitor is greater than or equal to a capacitance of the first boost capacitor.

9. The charge pump circuit of claim 1, further comprising:
a read protection transistor comprising a first terminal coupled to the second terminal of the output transfer transistor, a second terminal, and a control terminal configured to receive a bias voltage; and
a read transistor comprising a first terminal coupled to the second terminal of the read protection transistor, a second terminal, and a control terminal configured to receive the enabling signal.

10. The charge pump circuit of claim 1, wherein
the first pull-low circuit comprises:
a first pull-low transistor comprising a first terminal coupled to a ground terminal, a second terminal, and a control terminal configured to receive the pull-low signal; and
a first protection transistor comprising a first terminal coupled to the second terminal of the first pull-low transistor, a second terminal coupled to the control terminal of the first transfer transistor, and a control terminal configured to receive a bias voltage; and
the output pull-low circuit comprises:
an output pull-low transistor comprising a first terminal coupled to the ground terminal, a second terminal, and a control terminal configured to receive the pull-low signal; and
an output protection transistor comprising a first terminal coupled to the second terminal of the output pull-low transistor, a second terminal coupled to the control terminal of the output transfer transistor, and a control terminal configured to receive the bias voltage.

11. The charge pump circuit of claim 1, wherein:
the first charge pump stage further comprises a second gate-control transistor comprising a first terminal coupled to the second terminal of the first boost capacitor, a second terminal coupled to the control terminal of the first transfer transistor, and a control terminal configured to receive a fourth phase signal; and
the first terminal of the first pull-low circuit is configured to receive the fourth phase signal.

12. The charge pump circuit of claim 11, wherein
the first pull-low circuit comprises:
a first pull-low transistor comprising a first terminal coupled to a ground terminal, a second terminal, and a control terminal configured to receive the fourth phase signal; and
a first protection transistor comprising a first terminal coupled to the second terminal of the first pull-low transistor, a second terminal coupled to the control terminal of the first transfer transistor, and a control terminal configured to receive a bias voltage; and
the output pull-low circuit comprises:
an output pull-low transistor comprising a first terminal coupled to the ground terminal, a second terminal, and a control terminal configured to receive the pull-low signal; and
an output protection transistor comprising a first terminal coupled to the second terminal of the output pull-low transistor, a second terminal coupled to the control terminal of the output transfer transistor, and a control terminal configured to receive the bias voltage.

13. The charge pump circuit of claim 11, wherein
the second phase signal and the third phase signal are anti-phase;
the first phase signal and the fourth phase signal are anti-phase; and
a falling edge of a pulse in the first phase signal lags a falling edge of a pulse in the second phase signal, and a rising edge of the pulse in the first phase signal leads a rising edge of the pulse in the second phase signal.

14. A charge pump circuit for generating a first voltage in an erasing operation, a second voltage in a program operation and a third voltage in a read operation, the charge pump circuit comprising:
a power switch comprising a first terminal configured to receive an input voltage, a second terminal and a control terminal configured to receive an enabling signal;
a first pull-low circuit comprising a first terminal configured to receive a pull-low signal, and a second terminal;
a second pull-low circuit comprising a first terminal configured to receive the pull-low signal, and a second terminal;
an output pull-low circuit comprising a first terminal configured to receive the pull-low signal, and a second terminal;
a first charge pump stage comprising:
a first boost capacitor comprising a first terminal configured to receive a fourth phase signal, and a second terminal;
a first transfer transistor comprising a first terminal coupled to the second terminal of the power switch, a second terminal, and a control terminal coupled to the second terminal of the first boost capacitor and the second terminal of the first pull-low circuit;
a first gate-control transistor comprising a first terminal coupled to the control terminal of the first transfer transistor, a second terminal coupled to the second terminal of the first transfer transistor, and a control terminal coupled to the second terminal of the power switch; and
a first storage capacitor comprising a first terminal configured to receive a third phase signal, and a second terminal coupled to the second terminal of the first transfer transistor;
a second charge pump stage comprising:
a second boost capacitor comprising a first terminal configured to receive a first phase signal, and a second terminal;
a second transfer transistor comprising a first terminal coupled to the second terminal of the first storage capacitor, a second terminal, and a control terminal coupled to the second terminal of the second boost capacitor and the second terminal of the second pull-low circuit;

a second gate-control transistor comprising a first terminal coupled to the control terminal of the second transfer transistor, a second terminal coupled to the second terminal of the second transfer transistor, and a control terminal coupled to the second terminal of the first storage capacitor; and a second storage capacitor comprising a first terminal configured to receive a second phase signal, and a second terminal coupled to the second terminal of the second transfer transistor; and an output charge pump stage comprising:

an output boost capacitor comprising a first terminal configured to receive the third phase signal, and a second terminal;

an output transfer transistor comprising a first terminal coupled to the second terminal of the second storage capacitor, a second terminal configured to output the first voltage, the second voltage or the third voltage, and a control terminal coupled to the second terminal of the output boost capacitor and the second terminal of the output pull-low circuit; and an output gate-control transistor comprising a first terminal coupled to the control terminal of the output transfer transistor, a second terminal coupled to the second terminal of the output transfer transistor, and a control terminal coupled to the second terminal of the first storage capacitor.

15. The charge pump circuit of claim 14, wherein in the erasing operation, the first phase signal, the second phase signal and the third phase signal and the fourth phase signal are toggled, the enabling signal turns on the power switch, and the pull-low signal enables the first pull-low circuit to disconnect the first transfer transistor from a ground terminal, enables the second pull-low circuit to disconnect the second transfer transistor from the ground terminal, and enables the output pull-low circuit to disconnect the output transfer transistor from the ground terminal.

16. The charge pump circuit of claim 15, wherein:

the second phase signal and the third phase signal are anti-phase;

a falling edge of a pulse in the first phase signal lags a falling edge of a pulse in the second phase signal, and a rising edge of the pulse in the first phase signal leads a rising edge of the pulse in the second phase signal; and a falling edge of a pulse in the fourth phase signal lags a falling edge of a pulse in the third phase signal, and a rising edge of the pulse in the fourth phase signal leads a rising edge of the pulse in the third phase signal.

17. The charge pump circuit of claim 14, wherein in the program operation, the first phase signal, the second phase signal, the third phase signal and the fourth phase signal are substantially constant, and the enabling signal turns on the power switch, and the pull-low signal enables the first pull-low circuit to couple the first transfer transistor to a ground terminal, enables the second pull-low circuit to couple the second transfer transistor to the ground terminal, and enables the output pull-low circuit to couple the output transfer transistor to the ground terminal.

18. The charge pump circuit of claim 14, wherein in the read operation, the first phase signal, the second phase signal the third phase signal and the fourth phase signal are substantially constant, and the enabling signal turns off the power switch, and the pull-low signal enables the first pull-low circuit to disconnect the first transfer transistor from a ground terminal, enables the second pull-low circuit to disconnect the second transfer transistor from the ground terminal, and enables the output pull-low circuit to disconnect the output transfer transistor from the ground terminal.

19. The charge pump circuit of claim 14, wherein a capacitance of the first storage capacitor is greater than a capacitance of the first boost capacitor, and a capacitance of the output boost capacitor is greater than or equal to the capacitance of the first boost capacitor.

20. The charge pump circuit of claim 14, further comprising:

a read protection transistor comprising a first terminal coupled to the second terminal of the output transfer transistor, a second terminal, and a control terminal configured to receive a bias voltage; and a read transistor comprising a first terminal coupled to the second terminal of the read protection transistor, a second terminal, and a control terminal configured to receive the enabling signal.

* * * * *